(12) United States Patent
Tong et al.

(10) Patent No.: US 12,235,725 B2
(45) Date of Patent: Feb. 25, 2025

(54) MULTI-TIME PROGRAMMABLE ELECTRONIC FUSE APPARATUS

(71) Applicant: ESPRESSIF SYSTEMS (SHANGHAI) CO., LTD., Shanghai (CN)

(72) Inventors: Li Tong, Shanghai (CN); Changbing Zhao, Shanghai (CN)

(73) Assignee: ESPRESSIF SYSTEMS (SHANGHAI) CO., LTD., Shanghai (CN)

( * ) Notice: Subject to any disclaimer, the term of this patent is extended or adjusted under 35 U.S.C. 154(b) by 82 days.

(21) Appl. No.: 18/260,221

(22) PCT Filed: Dec. 31, 2021

(86) PCT No.: PCT/CN2021/143721
§ 371 (c)(1),
(2) Date: Jun. 30, 2023

(87) PCT Pub. No.: WO2022/143991
PCT Pub. Date: Jul. 7, 2022

(65) Prior Publication Data
US 2024/0078155 A1  Mar. 7, 2024

(30) Foreign Application Priority Data
Dec. 31, 2020  (CN) .......................... 202011633509.1

(51) Int. Cl.
*G06F 11/14* (2006.01)
*G11C 17/16* (2006.01)

(52) U.S. Cl.
CPC .... *G06F 11/1402* (2013.01); *G06F 2201/805* (2013.01); *G11C 17/16* (2013.01)

(58) Field of Classification Search
CPC ..................... G06F 11/1402; G06F 2201/805; G11C 17/16
See application file for complete search history.

(56) References Cited

U.S. PATENT DOCUMENTS

2019/0108893 A1  4/2019  Shim
2020/0372964 A1  11/2020  Nakajima

FOREIGN PATENT DOCUMENTS

CA          3098344 A1 * 10/2019 ............ E05B 45/06
CN        106297887 A      1/2017
(Continued)

*Primary Examiner* — Samir W Rizk
(74) *Attorney, Agent, or Firm* — Aird & McBurney LP

(57) ABSTRACT

The present application discloses a multi-time programmable electronic fuse apparatus, including: a one-time programmable cell module, a parsing module and a multi-time programmable cell module. The one-time programmable cell module is configured to store one-time programmable data, the multi-time programmable cell module includes a storage cell array capable of reading and writing data multiple times and is configured to store multi-time programming data. The parsing module is configured to read the one-time programming data transmitted from the one-time programmable cell module, to write the parsed initialization data into the multi-time programmable cell module upon reading the initialization data; to parse the fix data to obtain a fix location and a fix value upon reading the fix data, and to replace data stored in the corresponding fix location in the storage cell array with the fix value.

20 Claims, 3 Drawing Sheets

(56) References Cited

FOREIGN PATENT DOCUMENTS

| CN | 109002316 | A | 12/2018 |
| CN | 109147858 | A | 1/2019 |
| CN | 111240578 | A | 6/2020 |
| CN | 113314180 | A | 8/2021 |

* cited by examiner

MULTI-TIME PROGRAMMABLE ELECTRONIC FUSE APPARATUS

CROSS-REFERENCE TO RELATED APPLICATIONS

This application is the U.S. National Phase application under 35 U.S.C. § 371 of International Patent Application No. PCT/CN2021/143721 filed on Dec. 31, 2021, which claims priority to Chinese Patent Application CN202011633509.1 filed on Dec. 31, 2020. The disclosures of the aforementioned applications are hereby incorporated by reference in their entireties.

TECHNICAL FIELD

The present application relates to the field of semiconductor storage technology, and in particular to a multi-time programmable electronic fuse apparatus.

BACKGROUND

The electronic fuse (eFuse) is a one-time programmable (OTP) device, which is widely used inside a chip to store important information, such as chip version data, voltage of external devices, parameters that need to be set for chip startup, important settings for analog and digital circuits, fix locations for memory error bits, security-related keys, etc. The electronic fuse has very high reliability and a relatively small area, but in practice it often encounters the problem of difficulty in making a fix to the programmed content. The electronic fuse stores bit information by whether the fuse is burnt or not, usually representing bit 0 when unburnt and bit 1 when burnt. The initial state of the electronic fuse is all 0s. The corresponding fuse at the position where 1 needs to be written should be burnt. Since the fuse cannot be restored after being burnt, resulting in that an electronic fuse can be written from 0 to 1, but cannot be written back to 0 from 1, and thus the electronic fuse has a one-time programmable (OTP) characteristic. In the actual chip production, debugging, testing, use and other aspects, the one-time programmable (OTP) characteristic leads to a lot of troubles: for example, in a production process, a small programming or burning error will lead to a large number of chip scrap; in a debugging process, it is not possible to fix a certain bit to observe different fault phenomena; in a test process, it is not possible to repeatedly enter and exit a certain test mode; in a use process, it is not possible for the chip that has been programed, to be upgraded online for the electronic fuse content, etc.

In view of the above, it is necessary to provide an apparatus that allows an electronic fuse, which originally has only a one-time programmable (OTP) capability, to have multiple fix capability.

SUMMARY

In order to solve the above problems, the present application provides a multi-time programmable electronic fuse apparatus, including: a one-time programmable cell module, a parsing module, and a multi-time programmable cell module.

The one-time programmable cell module includes an electronic fuse array configured to store one-time programmable data, and the one-time programmable data includes initialization data and fix data; the multi-time programmable cell module includes a storage cell array capable of reading and writing data multiple times and is configured to store multi-time programmable data.

The parsing module is configured to: read the one-time programmable data transmitted from the one-time programmable cell module, write the parsed initialization data into the multi-time programmable cell module upon reading the initialization data; parse the fix data to obtain a fix location and a fix value upon reading the fix data, and replace data stored in the corresponding fix location in the storage cell array with the fix value.

Optionally, the apparatus further includes: a multi-time programmable interface module configured to receive a control instruction, and to perform data reading or data writing operation on the multi-time programmable cell module.

Optionally, the apparatus further includes: an arbiter electrically connected to the parsing module and the multi-time programmable interface module respectively and configured to arbitrate data writing operations of the parsing module and the multi-time programmable interface module on the multi-time programmable cell module.

Optionally, the apparatus further includes: a one-time programmable interface module configured to receive a control instruction, and to perform data reading or data writing operation on the one-time programmable cell module.

Optionally, the apparatus further includes: a one-time programmable programming module electrically connected to the one-time programmable interface module and the one-time programmable cell module respectively, and configured to receive a programming instruction transmitted from the one-time programmable interface module, transmit data to be programmed to the corresponding storage location in the one-time programmable cell module according to a programming timing, and perform a programming operation.

Optionally, the apparatus further includes: a one-time programmable reading module electrically connected to the one-time programmable interface module and the one-time programmable cell module respectively, configured to receive a read instruction transmitted from the one-time programmable interface module, to read the data corresponding to the storage location in the one-time programmable cell module according to a read timing, and to return the read data via the one-time programmable interface module.

Optionally, the one-time programmable data further includes user-defined user data; the electronic fuse array in the one-time programmable cell module is configured to include an initialization region, a fix region and a user region.

The initialization region is configured to store the initialization data.

The fix region is configured to store the fix data.

The user region is configured to store the user data.

Optionally, the fix region and the user region share a portion of the electronic fuse array other than the initialization region, the fix data and the user data are written from each end of the portion respectively, and the space in the portion that has not been written by data is used as a backup region.

Optionally, the fix data includes one or more fix commands, and each fix command is a bit-based fix command, a byte-based fix command or a reserved command. The bit-based fix command includes a command identifier, a page address, a bit fix value, and a bit offset address. The byte-based fix command includes a command identifier, a page address, and a byte mask word, a byte fix value.

The command identifier is configured to identify the type of a current command as a bit-based fix command or a byte-based fix command. The page address is configured to identify a page address corresponding to the fix location. The bit fix value is configured to identify a fix value of a bit. The bit offset address is configured to identify an offset address of the fix location in the corresponding page. The byte mask word is configured to identify a byte location of the fix location in the corresponding page. The byte fix value is configured to identify a fix value of a byte.

Optionally, the parsing module is configured to, in response to the command identifier being detected as a bit-based fix command, obtain the fix location by parsing the page address and the bit offset address, and obtain the fix value corresponding to the fix bit location by parsing the bit fix value.

Optionally, the bit-based fix command further includes: an extended bit fix value configured to identify an extended fix value when the bit fix value is an extended fix identifier.

Optionally, the parsing module is configured to read the numerical value in the extended bit fix value as the fix value when the bit fix value is detected as an extended fix identifier.

Optionally, the byte-based fix command includes a single byte-based fix command and a multi-byte-based fix command.

Optionally, the parsing module is configured to, in response to the command identifier being detected as a byte-based command identifier, obtain the fix location by parsing the page address and the byte mask word, and obtain the fix value corresponding to the fix byte location by parsing the byte fix value.

Optionally, the command identifier is further configured to identify the type of the current command as a reserved command. The parsing module is configured to end the fix process in response to the reserved command being detected as an identifier for ending the fix, and to move to a next fix command to continue the fix in response to the reserved command being detected as an identifier for skipping to continue.

Optionally, the storage cell array of the multi-time programmable cell module at least includes a multi-time programmable storage region, and the multi-time programmable storage region has the same storage space size as the initialization region in the one-time programmable cell module.

Optionally, the one-time programmable cell module is an array composed of electronic fuses.

Optionally, the multi-programmable electronic fuse apparatus is arranged in an embedded system.

Optionally, the multi-time programmable cell module is an array composed of a group of control registers in the embedded system.

Optionally, the multi-time programmable interface module is a system interface in the embedded system.

The present application provides a multi-time programmable electronic fuse apparatus, including: a one-time programmable cell module, a parsing module and a multi-time programmable cell module. The one-time programmable cell module includes an electronic fuse array configured to store one-time programmable data, and the one-time programmable data includes initialization data and fix data. The multi-time programmable cell module includes a storage cell array capable of reading and writing data multiple times and is configured to store multi-time programmable data. The parsing module is configured to read the one-time programmable data transmitted from the one-time programmable cell module, to write the parsed initialization data into the multi-time programmable cell module upon reading the initialization data, to obtain the fix location and the fix value by parsing upon reading the fix data, and to replace data stored in the corresponding fix location in the storage cell array with the fix value. This application provides a multi-time programmable electronic fuse apparatus that enables the electronic fuse, which originally has only a one-time programmable capability, to have multiple fix capability, which improves the flexibility of use. In addition, this application can accomplish multi-time programming by adding a small amount of hardware, keeping the hardware size small even when the number of fused bits is very large.

BRIEF DESCRIPTION OF THE DRAWINGS

In the following, the present application will be further explained on the basis of embodiments with reference to the attached drawings.

DETAILED DESCRIPTION OF THE PREFERRED EMBODIMENTS

The apparatus of the present application will be described in detail below with reference to the accompanying drawings and specific embodiments. It should be understood that the embodiments shown in the accompanying drawings and described hereinafter are merely illustrative and not intended to limit the disclosure.

Figure 1:
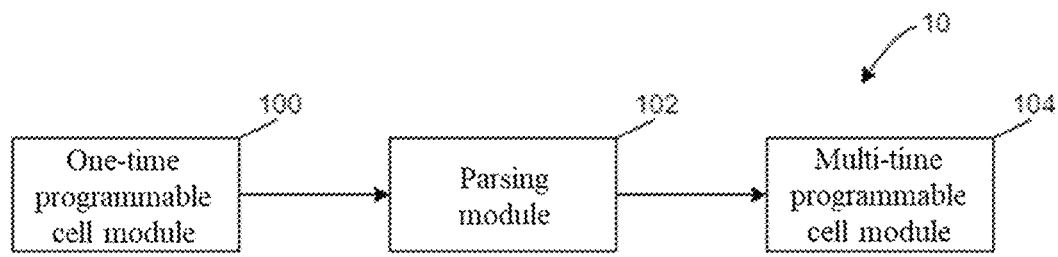
FIG. 1 schematically shows a structural block diagram of a multi-time programmable electronic fuse apparatus 10 provided by the present application.

FIG. 1 shows a structural block diagram of a multi-time programmable electronic fuse apparatus 10 provided by the present application. In this embodiment, the multi-time programmable electronic fuse apparatus 10 includes: a one-time programmable cell module 100, a parsing module 102 and a multi-time programmable cell module 104.

In particular, the one-time programmable cell module 100 includes an electronic fuse array configured to store one-time programmable data, and the one-time programmable data includes initialization data and fix data. The multi-time programmable cell module 104 includes a storage cell array capable of reading and writing data multiple times and is configured to store multi-time programmable data.

The parsing module 102 is configured to read the one-time programmable data transmitted from the one-time programmable cell module 100, to write the parsed initialization data into the multi-time programmable cell module 104 upon reading the initialization data, to parse to obtain the fix location and a fix value upon reading the fix data, and to replace data stored in the corresponding fix location in the storage cell array with the fix value.

In this embodiment, the multi-time programmable cell module 104 is a storage cell array capable of reading and writing data multiple times under powered conditions. Specifically, it can be a group of registers.

On the basis of the above embodiments, the multi-time programmable electronic fuse apparatus provided by the present application may further include: a multi-time programmable interface module configured to receive a control instruction, and to perform data reading or data writing operation on the multi-time programmable cell module.

On the basis of the above embodiments, the multi-time programmable electronic fuse apparatus provided by the present application may further include: an arbiter electrically connected to the parsing module and the multi-time programmable interface module respectively and configured to arbitrate data writing operations of the parsing module and the multi-time programmable interface module on the multi-time programmable cell module.

On the basis of the above embodiments, the multi-time programmable electronic fuse apparatus provided by the present application may further include: a one-time programmable interface module configured to receive a control instruction, and to perform data reading or data writing operation on the one-time programmable cell module.

On the basis of the above embodiments, the multi-time programmable electronic fuse apparatus provided by the present application may further include: a one-time programmable programming module electrically connected to the one-time programmable interface module and the one-time programmable cell module respectively, and configured to receive a programming instruction transmitted from the one-time programmable interface module, to transmit data to be programmed to the corresponding storage location in the one-time programmable cell module according to a programming timing, and to perform a programming operation.

On the basis of the above embodiments, the multi-time programmable electronic fuse apparatus provided by the present application may further include: a one-time programmable reading module electrically connected to the one-time programmable interface module and the one-time programmable cell module respectively, and configured to receive a read instruction transmitted from the one-time programmable interface module, to read data corresponding to the storage location in the one-time programmable cell module according to a read timing, and to return the read data via the one-time programmable interface module.

This application provides the multi-time programmable electronic fuse apparatus that enables the electronic fuse, which originally has only one-time programmable capability, to have multiple fix capability, which improves the flexibility of use. Moreover, the multi-time programming can be accomplished by adding a small amount of hardware, and the hardware size small can be kept small even when the number of fused bits is very large.

The one-time programmable data stored in the one-time programmable cell module of the embodiment of the present application includes initialization data and fix data. The initialization data is the basis for implementing the multi-time programming, which ensures that merely the incremental part is required to be fixed for subsequent multi-time programming. The fix data is the key to implement the multi-time programming. The fix command is obtained by parsing the fix data, and both the specific location and the numerical value to be fixed, which are required for fixing the initialization data, can be quickly determined, so that the fix can be performed directly. Compared with the storage data that needs to be replaced by an overall fix in the existing art, the embodiment of the present application adopts a local incremental fix approach, which merely adds a small amount of control circuits such as the parsing module, and does not require a large area of backup resources in the hardware, and has a smaller resource overhead. In addition, the fix scale, the number of fixes, and the fix approach can be flexibly adjusted in this application, which can support various forms such as a single-bit fix, a single-byte fix or multi-byte fix, with higher flexibility. The concept of this application comes from long-term work experience in the field of IC research and development, based on the various user needs learnt from a large number of mass-produced ICs. This application can better balance hardware resources and flexibility to fully meet the various electronic fuse rewriting scenarios of users.

Figure 2:
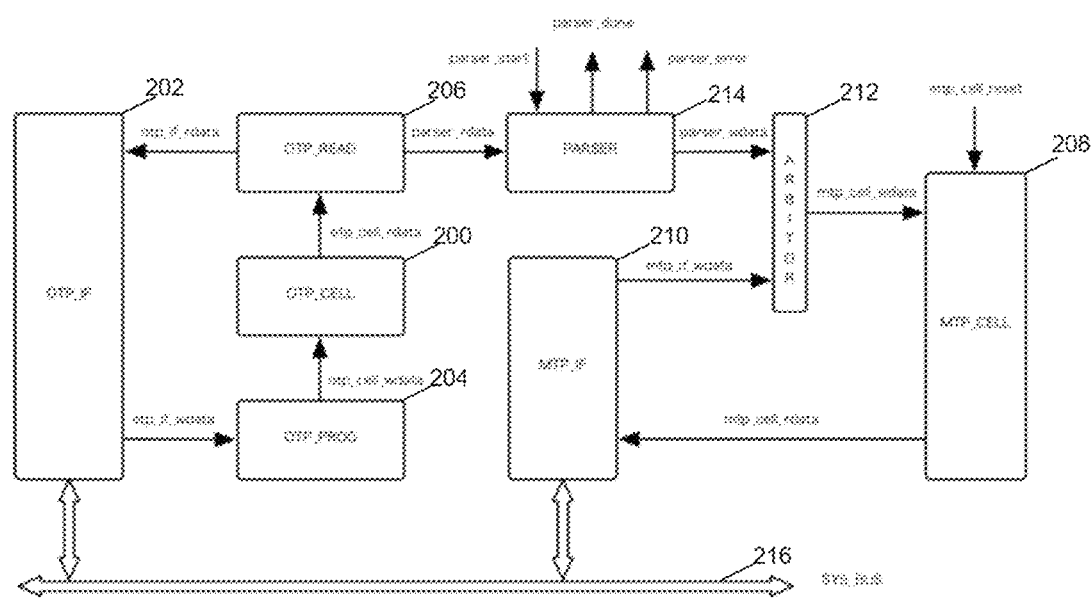
FIG. 2 schematically shows a structural block diagram of another embodiment of the multi-time programmable electronic fuse apparatus provided by the present application.

Referring to FIG. 2, which is a structural block diagram of another embodiment of the multi-time programmable electronic fuse apparatus provided by the present application. In this embodiment, the apparatus specifically includes: a one-time programmable cell module (OTP_CELL) 200, a one-time programmable interface module (OTP_IF) 202, a one-time programmable programming module (OTP_PROG) 204, a one-time programmable reading module (OTP_READ) 206, a multi-time programmable cell module (MTP_CELL) 208, a multi-time programmable interface module (MTP_IF) 210, an arbiter (ARBITOR) 212, a parsing module (PARSER) 214 and a system bus (SYS_BUS) 216.

The one-time programmable cell module (OTP_CELL) 200 is an array composed of electronic fuses, and is configured to store one-time programmable data. The one-time programmable data includes initialization data and fix data.

The one-time programmable interface module (OTP_IF) 202 is configured to receive a control instruction, and to perform data reading or data writing operation on the multi-time programmable cell module 200.

The one-time programmable programming module (OTP_ PROG) 204 is electrically connected to the one-time programmable interface module 202 and the one-time programmable cell module 200 respectively, and is configured to receive the programming instruction transmitted from the one-time programmable interface module 202, and to transmit the data to be programmed to the corresponding storage location in the one-time programmable cell module 200 according to the programming timing, and to perform the programming operation.

The one-time programmable read module (OTP_READ) 206 is electrically connected to the one-time programmable interface module 202 and the one-time programmable cell module 200 respectively, and is configured to receive the read instruction transmitted from the one-time programmable interface module 202, and to read the data corresponding to the storage location in the one-time programmable cell module 200 according to the read timing, and to return the read data via the one-time programmable interface module 202.

The multi-time programmable cell module (MTP_CELL) 208 includes a storage cell array capable of reading and writing data multiple times, and is configured to store multi-time programmable data. Specifically, in this embodiment, it may be composed of a register array.

The multi-time programmable interface module (MTP_IF) 210 is configured to receive a control instruction, and to perform data reading or data writing operation on the multi-time programmable cell module.

The arbiter (ARBITER) 212 is electrically connected to the parsing module 214 and the multi-time programmable interface module 210 respectively, and is configured to arbitrate the data writing operations of the parsing module 214 and the multi-time programmable interface module 210 on the multi-time programmable cell module 208.

The parsing module (PARSER) 214 is configured to read the one-time programming data transmitted from the one-time programmable cell module 200, and to write the parsed initialization data into the multi-time programmable cell module 208 upon reading the initialization data; to parse to obtain the fix location and a fix value upon reading the fix data, and to replace data stored in the corresponding fix location in the register array with the fix value.

The system bus (SYS_BUS) 216, via which the system master device controls each functional module.

Based on each of the above-mentioned functional modules of the multi-time programmable electronic fuse apparatus provided by this application, the following functions can be achieved.

(1) Data programming of the one-time programmable cell module (OTP_CELL) 200. The system master device accesses the one-time programmable interface module (OTP_IF) 202 via the system bus (SYS_BUS) 216, to issue a programming instruction to the one-time programmable interface module (OTP_IF) 202 and to transmit data to be programmed. The one-time programmable interface module (OTP_IF) 202 transmits the data to be programmed to the one-time programmable programming module (OTP_PROG) 204 by a otp_if_wdata signal, and the one-time programmable programming module (OTP_PROG) 204 transmits the data to be programmed to the specified fuse one by one by a otp_cell_wdata signal according to the programming timing of the one-time programmable cell module (OTP_CELL) 200, and sends out a programming pulse to perform the programming operation to complete the data programming.

(2) Data reading of the one-time programmable cell module (OTP_CELL) 200. The system master device accesses the one-time programmable interface module (OTP_IF) 202 via the system bus (SYS_BUS) 216, to issue a read instruction. The one-time programmable interface module (OTP_IF) 202 transmits the read instruction to the one-time programmable reading module (OTP_READ) 206, and the one-time programmable reading module (OTP_READ) 206 reads the specified fuse data back by the otp_cell_rdata signal according to the read timing of the one-time programmable cell module (OTP_CELL) 200, and sends the specified fuse data back to the one-time programmable interface module (OTP_IF) 202 by the otp_if_rdata and eventually returned to the system master device via the system bus (SYS_BUS) 216.

(3) The parsing module (PARSER) 214 writes data to the multi-time programmable cell module (MTP_CELL) 208. The related circuit in the system sends a high-level pulse to parser_start, and the parsing module (PARSER) 214 starts to read data from the one-time programmable cell module (OTP_CELL) 200, and the data is sent to the parsing module (PARSER) 214 by parser_rdata for parsing. After valid data is parsed, the data is written to the arbiter (ARBITER) 212 by parser_wdata, and then written to a designated location in the multi-time programmable cell module (MTP_CELL) 208 by mtp_cell_wdata. After all the data has been parsed, parser_done will change from a low level to a high level. If invalid data is parsed, the current parser_wdata will not be written to the arbiter (ARBITER) 212, and the parsing process will be terminated, and parser error and parser_done will change from a low level to a high level.

(4) The system master device writes to the multi-time programmable cell module (MTP_CELL) 208. The system master device accesses the multi-time programmable interface module (MTP_IF) 210 via the system bus (SYS_BUS) 216, to send data to be written. The multi-time programmable interface module (MTP_IF) 210 writes the data to be written to the arbiter (ARBITER) 212 by mtp_if_wdata, and then writes the data to be written into the designated location of the multi-time programmable cell module (MTP_CELL) 208 by mtp_cell_wdata.

(5) Reset of the multi-time programmable cell module (MTP_CELL) 208. The related circuit in the system sends a high-level reset pulse to mtp_cell_reset, and the multi-time programmable cell module (MTP_CELL) 208 completes a reset operation, and the reset value can be given according to specific application requirements.

As a specific implementation, the multi-time programmable electronic fuse apparatus can be arranged in an embedded system, the multi-time programmable cell module is an array composed of a group of control registers in the embedded system, and the multi-time programmable interface module is a system interface in the embedded system. In this embodiment, the multi-time programmable cell module (MTP_CELL) adopts an array composed of an existing group of control registers in the embedded system, and the multi-time programmable interface module (MTP_IF) adopts an existing system interface in the embedded system, and the arbiter (ARBITER) enables the parsing module (PARSER) to access the multi-time programmable cell module (MTP_CELL), so as to realize the function of fixing the content of the control register on the original system. No additional hardware resources need to be consumed to keep the hardware size small.

The embodiment of the present application can also perform partitioning management on the one-time programmable cell module (OTP_CELL) 200 and the multi-time programmable cell module (MTP_CELL) 208, and different manners of partitioning can be set according to different parsing modules (PARSER) 214.

As a specific implementation, the electronic fuse array in the one-time programmable cell module (OTP_CELL) 200 is configured to include an initialization region (INIT_REGION), a fix region (FIX_REGION), a backup region (BAK_REGION) and a user region (USER_REGION). The initialization region (INIT_REGION) is configured to store initialization data, which may include, for example, data required for hardware such as control parameters and various types of key data required after power-on, and may, of course, include data required to be read by software, etc. The fix region (FIX_REGION) is configured to store fix data; based on the fix data, the data at the fix location in the initialization data can be fixed in a targeted way. The user region (USER_REGION) is configured to store user-defined user data. The backup region (BAK_REGION) can be flexibly allocated to the fix region (FIX_REGION) and the user region (USER_REGION) as a backup space. As a specific implementation, the fix region (FIX_REGION) and the user region (USER_REGION) can share the part of the electronic fuse array other than the initialization region (INIT_REGION), and the fix data and the user data are written from each end of the portion respectively, and the space in that portion that has not been written by data is used as a backup region (BAK_REGION). This implementation can ensure flexibility of using the storage space and ensure that the storage space can be fully utilized.

As a specific implementation, the storage cell array of the multi-time programmable cell module at least includes a multi-time programmable storage region, and the multi-time programmable storage region has the same storage space size as the initialization region in the one-time programmable cell module, to facilitate fast copy processing of the circuit. Of course, it can be understood that the storage cell array of the multi-time programmable cell module may further include other regions for storing other data.

Figure 3:
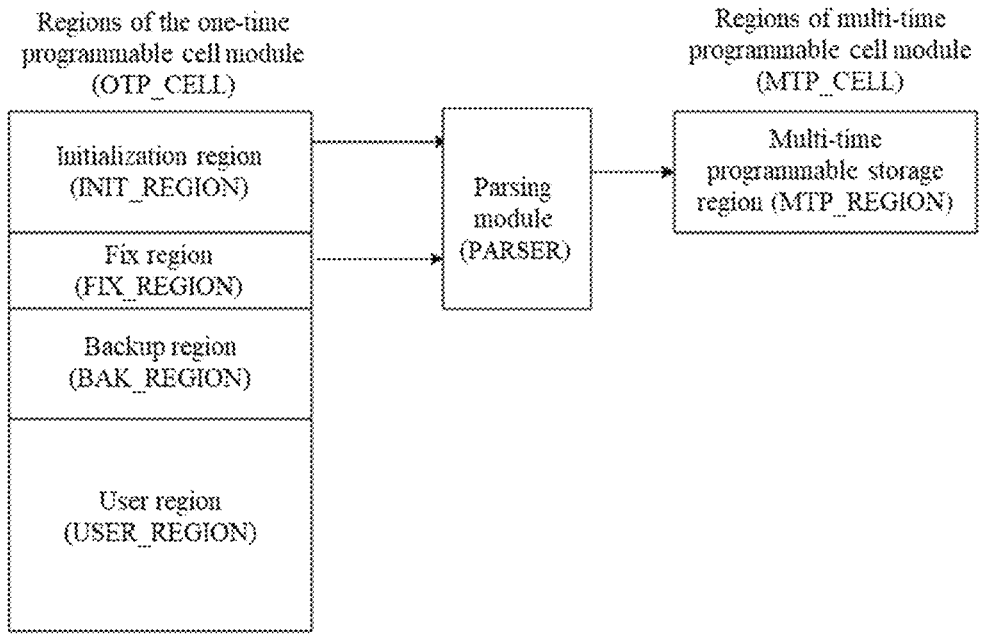
FIG. 3 shows a schematic diagram of a specific manner of partitioning for a one-time programmable cell module (OTP_CELL) and a multi-time programmable cell module (MTP_CELL).

FIG. 3 shows a schematic diagram of a specific manner of partitioning for the one-time programmable cell module (OTP_CELL) and the multi-time programmable cell module (MTP_CELL). The regions of the one-time programmable cell module (OTP_CELL) 200 include: an initialization region (INIT_REGION), a fix region (FIX_REGION), a backup region (BAK_REGION) and a user region (USER_REGION). The multi-time programmable cell module (MTP_CELL) can be divided into multiple blocks according to actual application requirements, and at least one of which is the multi-time programmable storage region (MTP_REGION), and merely the multi-time programmable storage region (MTP_REGION) is shown in FIG. 3. In this embodiment, the storage space size of the multi-time programmable storage region (MTP_REGION) is the same as the initialization region (INIT_REGION) in the one-time programmable cell module (OTP_CELL). The multi-time programmable storage region (MTP_REGION) can ensure data synchronization with the one-time programmable cell module (OTP_CELL). It can be understood that the multi-time programmable cell module (MTP_CELL) may also include other regions for storing other MTP data, which is not limited herein. Other MTP data can be rewritten and read through the multi-time programmable interface module (MTP_IF), without saving after power-off.

As a specific implementation, the address of the one-time programmable cell module (OTP_CELL) is arranged to grow downward, that is, the topmost region is the lowest address, and usually 0 can be taken as the lowest address. The bottommost region is the highest address, and usually the maximum address value that can be allowed by the one-time programmable cell module (OTP_CELL) can be taken as the highest address.

As a specific implementation, the address of the multi-time programmable cell module (OTP_CELL) is also arranged to grow downward, that is, the topmost region is the lowest address, and usually 0 can be taken as the lowest address. The bottommost region is the highest address, and usually the maximum address value that can be allowed by the multi-time programmable cell module (OTP_CELL) can be taken as the highest address.

The initialization region (INIT_REGION) is configured to store data bits that may need to be fixed multiple times. The system uses these data bits through the multi-time programmable storage region (MTP_REGION). In the case of no need to fix any data bits, the content of the initialization region (INIT_REGION) are copied to the multi-time programmable storage region (MTP_REGION) in original form by the parsing module (PARSER) 214, and then the parsing module (PARSER) 214 pulls up the parser_done signal and pulls down the parser error signal, so that the system can use these data bits. When it is found that the data bits need to be fixed, it is required to add a fix command in the fix region (FIX_REGION), and the parsing module (PARSER) 214 starts to fix after reading these commands, and fixes the data at the specified location based on the data in the multi-time programmable storage region (MTP_REGION) that has been initialized by the initialization region (INIT_REGION). These fix commands can be very flexible, and various types of fixes can be performed according to different command codes. This flexibility is reflected in the selection of the fix location and the fix content in various ways such as a single-bit-based way, a single-byte-based way, and a multi-byte-based way.

The user region (USER_REGION) is configured to store data defined by the user, and these data are read by the one-time programmable read module (OTP_READ) 206 for use by the system software. Since the data is completely user-defined, the system software can also include a function of the parsing module (PARSER), to provide the ability to fix the data content of the region multiple times. Of course, a solution that does not support content fix can also be adopted. The user region (USER_REGION) can be used in a pagination manner, with each page arranged in a number of bytes, and a newly added page being placed in the unused space at the top of the user region (USER_REGION), so as to provide the upward growth feature of the user region (USER_REGION).

The backup region (BAK_REGION) can be flexibly allocated to the fix region (FIX_REGION) and the user region (USER_REGION) as a backup space. As a specific implementation, as shown in FIG. 3, the upper bound of the backup region (BAK_REGION) is determined by the usage of the fix region (FIX_REGION), and the lower bound of the space is determined by the usage of the user region (USER_REGION). For example, in an application scenario where the content of the multi-programming storage region (MTP_REGION) needs to be fixed multiple times, the fix region (FIX_REGION) grows downward; whilst user data needs to be continuously added, the user region (USER_REGION) grows upward. When the backup region (BAK_REGION) is finally reduced to zero, no new fix command can be added, nor can new user data be added. Generally, in practical applications, it is difficult to estimate the number of fixing times in advance, and it is also impossible to anticipate the amount of user data. The existence of the backup region (BAK_REGION) allows flexible allocation of electronic fuse resources to these two application requirements.

As a specific implementation, the multi-time programmable storage region (MTP_REGION) may be mapped to a group of registers that perform control of the system, and these registers may be hardware resources necessary to accomplish control of the system. Therefore, the multi-programming storage region (MTP_REGION) of the present application does not require additional storage elements, and the effect of multiple programming can be accomplished by using the characteristic that these registers can be repeatedly fixed. In the case of having a very large number of fuse bits, the hardware scale can also be kept small. Moreover, when it is used as system control, the control bits are usually relatively dispersed. For example, 256 control points need to be controlled independently, and it is more appropriate to use registers. When it is used as data, such as a key block, a memory or a register file can be used. Therefore, it is more flexible and convenient to map the multi-time programmable storage region into registers. Of course, the multi-time programmable storage region (MTP_REGION) can also be mapped to other storage devices, which is not limited herein.

Figure 4:
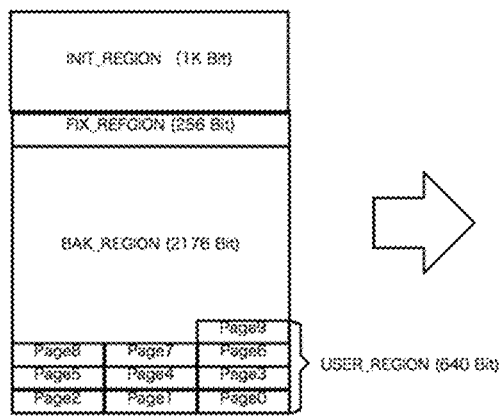
FIG. 4 schematically shows an example diagram of dynamic changes of each region of the one-time programmable cell module (OTP_CELL).
Figure 4:
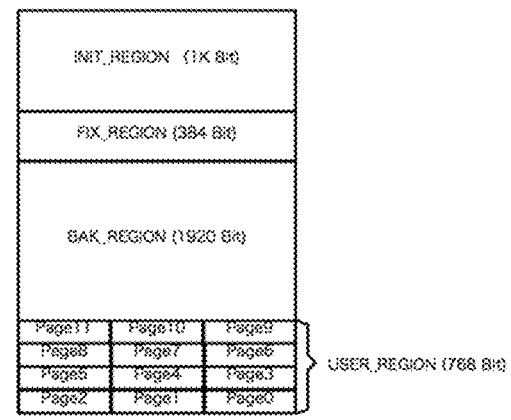

FIG. 4 shows an example diagram of dynamic changes of each region of the one-time programmable cell module (OTP_CELL). In this example, the one-time programmable cell module (OTP_CELL) has a total of 4K bits, where the initialization region (INIT_REGION) occupies 1K bits, and the remaining 3K bits are dynamically allocated to the fix region (FIX_REGION) and the user region (USER_REGION).

FIG. 4A is a schematic diagram of the usage state of the regions of the one-time programmable cell module (OTP_CELL) at a certain moment. The fix region (FIX_REGION) has a fix command of 256 bits. The user region (USER_REGION) has 10 pages of user data, 64 bits per page, 640 bits in total. The backup region (BAK_REGION) has 2,176 bits remaining.

FIG. 4B is a schematic diagram of the usage status of the regions in which the one-time programmable cell module (OTP_CELL) has been changed on the basis of FIG. 4A. Compared with FIG. 4A, the fix region (FIX_REGION) is added with a 128-bit fix command, and the fix region (FIX_REGION) is now expanded to 384 bits. The user region (USER_REGION) is added with 2 pages of user data, and the user region (USER_REGION) is now expanded to 12 pages, with a total of 768 bits. The backup region (BAK_REGION) has 1,920 bits remaining.

The embodiment of the present application uses fuses in a multi-region manner, which can ensure that each fuse can be fully utilized.

Specifically, the fix data may include one or more fix commands, and each fix command is a bit-based fix command, a byte-based fix command, or a reserved command. The byte-based fix command includes a single-byte-based fix command and a multi-byte-based fix command.

The bit-based fix command includes a command identifier (CMD), a page address (PAGE), a bit fix value (BITVAL), and a bit offset address (OFFSET). The byte-based fix command includes a command identifier (CMD), a page address (PAGE), a byte mask word (BYTEMASK), and a byte fix value (BYTEVAL). The command identifier is configured to identify a type of a current command as a bit-based fix command or a byte-based fix command. The page address is configured to identify a page address corresponding to the fix location. The bit fix value is configured to identify a fix value of a bit. The bit offset address is configured to identify an offset address of the fix location in the corresponding page. The byte mask word is configured to identify a byte location of the fix location in the corresponding page. The byte fix value is configured to identify a fix value of a byte.

The parsing module is configured to, in response to the command identifier being detected as a bit-based fix command, parse to obtain the fix location based on the page address and the bit offset address, and parse to obtain the fix value corresponding to the fix bit location based on the bit fix value. The bit-based fix command may further include: an extended bit fix value configured to identify an extended fix value when the bit fix value is an extended fix identifier. The parsing module is configured to read the numerical value in the extended bit fix value as the fix value when the bit fix value is detected as the extended fix identifier.

The parsing module is further configured to, in response to the command identifier being detected as a byte-based command identifier, parse to obtain the fix location based on the page address and the byte mask word, and parse to obtain the fix value corresponding to the fix byte location based on the byte fix value.

As a specific implementation, the bit-based fix command may be a variable-length instruction. As a specific implementation, the shortest command may contain only 4 bit fields (Field): a command identifier (CMD), a page address (PAGE), a bit fix value (BITVAL), and a bit offset address (OFFSET). In some embodiments, the bit-based fix command may further include an extended bit fix value (EXTBITVAL), configured to provide multiple additional fix opportunities. As shown in a specific format example of the bit-based fix command in Table 1 till Table 6, when the command identifier (CMD) bit field is 0001, the parsing module (PARSER) identifies the type of the current command as a bit-based fix command, and then reads the page address to be fixed from the page address (PAGE) bit field, then reads the offset address of the bit that needs to be fixed in the page from the bit offset address (OFFSET) bit field, and finally checks the bit fix value (BITVAL) bit field to read the bit fix value, which can be fixed to 0 or 1. When it is necessary to continue to fix a certain bit multiple times, it is necessary to write the bit fix value (BITVAL) bit field as 11 to enter the extended fix manner. At this point, the instruction can append multiple sets of extended bit fix values (EXTBITVAL) sequentially on the basis of the aforementioned 4 bit fields, with each set of EXTBITVAL bit fields being one byte, and each additional set of EXTBITVAL bit fields providing 8 additional fix opportunities. If a certain group of EXTBITVAL bit fields are all 1s, the subsequent byte is still a group of EXTBITVAL bit fields and so on until a group of EXTBITVAL bit fields being not all 1s is encountered.

TABLE 1

| Byte | Byte0 | | Byte1 | | Byte2 | Byte3 |
|---|---|---|---|---|---|---|
| Bits | <7:4> | <3:0> | <7:6> | <5:0> | <7:0> | <7:0> |
| Field | CMD | PAGE | BITVAL | OFFSET | EXTBITVAL | EXTBITVAL |

TABLE 2

| CMD | Command |
|---|---|
| 0001 | Bit-based fix |
| 0010 | Single byte-based fix |
| 0011 | Multi-byte-based fix |
| Other values | Reserved |

TABLE 3

| PAGE | Page address |
|---|---|
| 0000 | Select page 0 |
| 0001 | Select page 1 |
| ... | ... |
| 1111 | Select page 15 |

TABLE 4

| BITVAL | Bit fix value |
|---|---|
| 00 | Fixed to 0 |
| 01 | Fixed to 1 |
| 10 | Reserved |
| 11 | Extended fix |

TABLE 5

| OFFSET | Bit offset address |
|---|---|
| 000000 | Select the $0^{th}$ bit |
| 000001 | Select the $1^{st}$ bit |
| 000010 | Select the $2^{nd}$ bit |
| 000011 | Select the $3^{rd}$ bit |
| ... | ... |
| 111110 | Select the $62^{nd}$ bit |
| 111111 | Select the $63^{rd}$ bit |

TABLE 6

| EXTBITVAL | Extended bit fix value |
|---|---|
| 00000000 | Fixed to 0 |
| 00000001 | Fixed to 1 |
| 00000011 | Fixed to 0 |
| 00000111 | Fixed to 1 |
| 00001111 | Fixed to 0 |
| 00011111 | Fixed to 1 |
| 00111111 | Fixed to 0 |
| 01111111 | Fixed to 1 |
| 11111111 | Fix extension |

Similarly, the byte-based fix command is also a variable-length instruction. The shortest command is a single-byte fix command, which includes merely 4 bit fields (Field): a command identifier (CMD), a page address (PAGE), a byte mask word (BYTEMASK), and a byte fix value (BYTE-VAL). As shown in a specific format example of the byte-based fix command in Table 7 till Table 11, when the command identifier (CMD) bit field is 0010, the parsing module (PARSER) identifies the type of the current command as a byte-based fix command, and then reads the page address to be fixed from the page address (PAGE) bit field, then determines which byte in the page needs to be fixed from the bit offset address (OFFSET) bit field, and finally checks the bit fix value (BITVAL) bit field to read the bit fix value, which can be fixed to any desired value. In the single-byte fix command, the byte mask word (BYTE-MASK) bit field should only have one bit location that can be set to 1. If the parsing module (PARSER) detects that more than one location have 1, an error will be reported. When multiple bytes in a page need to be fixed, a multi-byte fix command needs to be used. In this command, the byte mask word (BYTEMASK) bit field should have multiple bit locations that can be set to 1. The number of 1 is the same as the number of groups of the subsequent bit fix value (BITVAL) bit field. If PARSER does not detect that multiple locations have 1, an error will be reported. The parsing module (PARSER) sequentially extracts the values of a plurality of consecutive byte fix value (BYTEVAL) bit fields according to the instruction of the byte mask word (BYTE-MASK) bit field, for fix operation.

The command identifier is further configured to identify the type of the current command as a reserved command. The parsing module is further configured to end the fix process in response to the reserved command being detected as an identifier for ending the fix, and to move to a next fix command to continue the fix in response to the reserved command being detected an identifier for skipping to continue. Table 12 lists a specific format example of the reserved command. The parsing module (PARSER) detects if a reserved command is encountered before finding a legitimate command. As shown in Table 12, a full 0 byte represents ending the fix, and a full 1 byte represents skipping the current fix command to continue with execution of the next fix command. The next byte of the last byte of the fix region (FIX_REGION) enters the backup region (BAK_REGION), where it is all 0s in the case of no programming and the parsing module (PARSER) will stop the fix. On the other hand, since there may be a maloperation resulting in programming a wrong command, the wrong command can be programmed as all 1s, and the parsing module (PARSER) will parse to obtain the command with all 1s, and will skip the current command and continue to read a next fix command. When the parsing module (PARSER) is processing a legitimate instruction, the full 0 byte or the full 1 byte will not be recognized as a reserved command, thereby ensuring that the fix value can be set to any value.

TABLE 7

| Byte | Byte0 | | Byte1 | Byte2 | Byte3 |
|---|---|---|---|---|---|
| Bits | <7:4> | <3:0> | <7:0> | <7:0> | <7:0> |
| Field | CMD | PAGE | BYTEMASK | BYTEVAL | BYTEVAL |

TABLE 8

| CMD | Command |
|---|---|
| 0001 | Bit-based fix |
| 0010 | Single byte-based fix |
| 0011 | Multi-byte-based fix |
| Other values | Reserved |

TABLE 9

| PAGE | Page address |
|---|---|
| 0000 | Select the $0^{th}$ page |
| 0001 | Select the $1^{st}$ page |
| ... | ... |
| 1111 | Select the $15^{th}$ page |

TABLE 10

| BYTEMASK | Byte mask word |
|---|---|
| 00000001 | Fix the $0^{th}$ byte |
| 00000010 | Fix the $1^{st}$ byte |
| 00000100 | Fix the $2^{nd}$ byte |
| 00001000 | Fix the $3^{rd}$ byte |
| 00010000 | Fix the $4^{th}$ byte |
| 00100000 | Fix the $5^{th}$ byte |
| 01000000 | Fix the $6^{th}$ byte |
| 10000000 | Fix the $7^{th}$ byte |

TABLE 11

| BITVAL | Byte fix value |
|---|---|
| xxxxxxxx | Any 8-bit fix value |

TABLE 12

| Reserved words in fix region | definition |
|---|---|
| 00000000 | End the fix |
| 11111111 | Skip to continue |

In this embodiment of the present application, the fix may be performed by bits, or multiple bytes may be fixed together. The maximum number of fix times for each fixable location does not need to be preset and can be flexibly configured. It can be understood that the above merely lists an example of the command format. Since the encoding and fields of the command can be adjusted flexibly, the settings can be made according to specific applications in practice. The features that need to be met for the settings include but are not limited to the following conditions:

(1) The number of fix times meets the condition of flexibility, that is, the number of fix times can range from 0 (no fix) to N (depending on the size of the fix region (FIX_REGION) and the backup region (BAK_REGION)). This condition can allow this application to be closer to the multi-time programmable characteristic.

(2) The fix granularity meets the condition of flexibility, that is, the specified single bit can be fixed multiple times, or randomly distributed bits can also be fixed, or a number of consecutive bytes can also be fixed. This condition can also allow this application to be closer to the multi-time programmable characteristic.

(3) The fix command code meets the condition of high-efficiency, that is, the space in the fix region (FIX_REGION) is occupied as little as possible while completing the same fix task, so that more space can be left for the user region (USER_REGION).

(4) An error recovery mechanism is included, and the command that is programming incorrectly can be erased and skipped.

Figure 5:
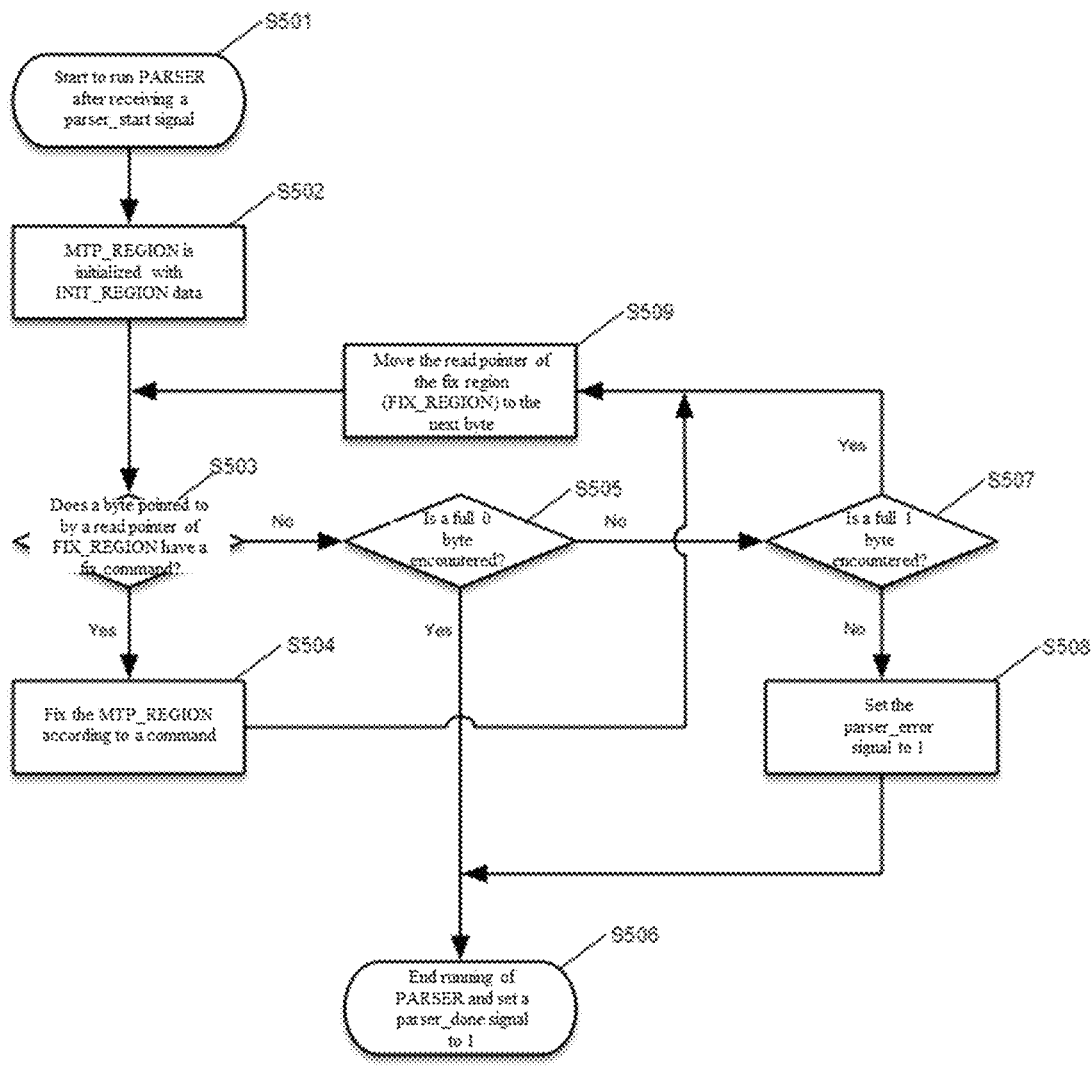
FIG. 5 schematically shows a flow chart of operations of a parsing module in the multi-time programmable electronic fuse apparatus provided by the present application.

Hereinafter, the process of initializing and fixing the multi-time programmable storage region (MTP_REGION) by the parsing module will be described in detail below in conjunction with FIG. 5, which shows a flow chart of operations of the parsing module in the multi-time programmable electronic fuse apparatus provided by the present application.

At S501, the parsing module (PARSER) starts to run after receiving the parser_start signal.

At S502, the multi-time programmable storage region (MTP_REGION) is initialized with the initialization data.

At S503, whether the byte pointed to by a read pointer of the fix region (FIX_REGION) has a fix command is determined, if yes, proceed to S504; if no, proceed to S505.

At S504, the multi-time programmable storage region (MTP_REGION) is fixed according to the command.

At S505, whether a full 0 byte is encountered is determined; if yes, proceed to S506; if no, proceed to S507.

At S506, the running of the parsing module (PARSER) is ended, and the parser_done signal is set to 1.

At S507, whether a full 1 byte is encountered is determined; if yes, proceed to S508; if no, proceed to S509.

At S508, after setting the parser error signal to 1, proceed to S506.

At S509, after moving the read pointer of the fix region (FIX_REGION) to the next byte, proceed to S503.

This application provides the multi-time programmable electronic fuse apparatus that enables the electronic fuse, which originally has only a one-time programmable capability, to have multiple fix capability, improving the flexibility of use. In addition, this application can be programmed multiple times by adding a small amount of hardware, keeping the hardware size small even when the number of fused bits is very large.

While various embodiments of various aspects of the present application have been described for the purpose of the disclosure, it shall not be understood that the teaching of the disclosure is limited to these embodiments. The features disclosed in a specific embodiment are therefore not limited to that embodiment, but may be combined with the features disclosed in different embodiments. For example, one or more features and/or operations of the method according to the present application described in one embodiment may also be applied individually, in combination or as a whole in another embodiment. It can be understood by those skilled in the art that more optional embodiments and variations are possible, and that various changes and modifications may be made to the system described above, without departing from the scope defined by the claims of the present disclosure.

What is claimed is:

1. A multi-time programmable electronic fuse apparatus, comprising: a one-time programmable cell module, a parsing module and a multi-time programmable cell module; wherein the one-time programmable cell module comprises an electronic fuse array configured to store one-time programmable data, and the one-time programmable data comprises initialization data and fix data;

the multi-time programmable cell module comprises a storage cell array capable of reading and writing data multiple times and is configured to store multi-time programmable data; and the parsing module is configured to read one-time programming data transmitted from the one-time programmable cell module, to write the parsed initialization data into the multi-time programmable cell module upon reading the initialization data; to parse the fix data to obtain a fix location and a fix value upon reading the fix data, and to replace data stored in the corresponding fix location in the storage cell array with the fix value.

2. The multi-time programmable electronic fuse apparatus according to claim 1, further comprising:

a multi-time programmable interface module configured to receive a control instruction, and to perform data reading or data writing operation on the multi-time programmable cell module.

3. The multi-time programmable electronic fuse apparatus according to claim 2, further comprising:

an arbiter electrically connected to the parsing module and the multi-time programmable interface module respectively and configured to arbitrate data writing operations of the parsing module and the multi-time programmable interface module on the multi-time programmable cell module.

4. The multi-time programmable electronic fuse apparatus according to claim 1, further comprising:

a one-time programmable interface module configured to receive a control instruction, and to perform data reading or data writing operation on the multi-time programmable cell module.

5. The multi-time programmable electronic fuse apparatus according to claim 4, further comprising:

a one-time programmable programming module electrically connected to the one-time programmable interface module and the one-time programmable cell module respectively, and configured to receive a programming instruction transmitted from the one-time programmable interface module, to transmit data to be programmed to the corresponding storage location in the one-time programmable cell module according to a programming timing, and to perform a programming operation.

6. The multi-time programmable electronic fuse apparatus according to claim 5, further comprising:

a one-time programmable reading module electrically connected to the one-time programmable interface module and the one-time programmable cell module, and configured to receive a read instruction transmitted from the one-time programmable interface module, to read the data corresponding to the storage location in the one-time programmable cell module according to a read timing, and to return the read data via the one-time programmable interface module.

7. The multi-time programmable electronic fuse apparatus according to claim 1, wherein the one-time programmable data further comprises user-defined user data; the electronic fuse array in the one-time programmable cell module is configured to comprise an initialization region, a fix region and a user region; wherein the initialization region is configured to store the initialization data;

the fix region is configured to store the fix data; and the user region is configured to store the user data.

8. The multi-time programmable electronic fuse apparatus according to claim 7, wherein the fix region and the user region share a portion of the electronic fuse array other than the initialization region, and the fix data and the user data are written from each end of the portion respectively, and the space in the portion that has not been written by data is used as a backup region.

9. The multi-time programmable electronic fuse apparatus according to claim 1, wherein the fix data comprises one or more fix commands, and each of the one or more fix commands is a bit-based fix command, a byte-based fix command or a reserved command, wherein the bit-based fix command comprises a command identifier, a page address, a bit fix value and a bit offset address, and the byte-based fix command comprises a command identifier, a page address, a byte mask word, and a byte fix value; wherein the command identifier is configured to identify a type of a current command as a bit-based fix command or a byte-based fix command; the page address is configured to identify a page address corresponding to the fix location; the bit fix value is configured to identify a fix value of a bit; the bit offset address is configured to identify an offset address of the fix location in the corresponding page; the byte mask word is configured to identify a byte location of the fix location in the corresponding page; and the byte fix value is configured to identify a fix value of a byte.

10. The multi-programmable electronic fuse apparatus according to claim 9, wherein the parsing module is configured to, in response to the command identifier being detected as a bit-based fix command, obtain the fix location by parsing the page address and the bit offset address, and obtain the fix value corresponding to the fix bit location by parsing the bit fix value.

11. The multi-programmable electronic fuse apparatus according to claim 10, wherein the bit-based fix command further comprises: an extended bit fix value configured to identify an extended fix value when the bit fix value is an extended fix identifier.

12. The multi-programmable electronic fuse apparatus according to claim 11, wherein the parsing module is configured to read the numerical value in the extended bit fix value as the fix value when the bit fix value is detected as an extended fix identifier.

13. He multi-programmable electronic fuse apparatus according to claim 9, wherein the byte-based fix command comprises a single byte-based fix command and a multi-byte-based fix command.

14. The multi-programmable electronic fuse apparatus according to claim 9, wherein the parsing module is configured to, in response to the command identifier being detected as a byte-based command identifier, obtain the fix location by parsing the page address and the byte mask word, and obtain the fix value corresponding to the fix byte location by parsing the byte fix value.

15. The multi-programmable electronic fuse apparatus according to claim 9, wherein the command identifier is further configured to identify the type of the current command as a reserved command; the parsing module is configured to end the fix process in response to the reserved command being detected as an identifier for ending the fix, and to move to a next fix command to continue the fix in response to the reserved command being detected an identifier for skipping to continue.

16. The multi-programmable electronic fuse apparatus according to claim 1, wherein the storage cell array of the multi-time programmable cell module at least comprises a multi-time programmable storage region, and the multi-time programmable storage region has a same storage space size as the initialization region in the one-time programmable cell module.

17. The multi-programmable electronic fuse apparatus according to claim 1, wherein the one-time programmable cell module is an array composed of electronic fuses.

18. The multi-programmable electronic fuse apparatus according to claim 1, wherein the multi-programmable electronic fuse apparatus is arranged in an embedded system.

19. The multi-programmable electronic fuse apparatus according to claim 18, wherein the multi-time programmable cell module is an array composed of a group of control registers in the embedded system.

20. The multi-programmable electronic fuse apparatus according to claim 18, wherein the multi-time programmable interface module is a system interface in the embedded system.

* * * * *